United States Patent
Kim (10) Patent No.: US 10,175,110 B2
(45) Date of Patent: Jan. 8, 2019

(54) PORTABLE HYPERSPECTRAL CAMERA APPARATUS HAVING SEMICONDUCTOR LIGHT EMITTING DEVICES

(71) Applicants: Hojun Yoon; Taek Kim

(72) Inventor: Taek Kim, Seongnam Gyeonggi-do (KR)

(73) Assignee: Hojun Yoon, Canyon Country, CA (US)

( * ) Notice: Subject to any disclaimer, the term of this patent is extended or adjusted under 35 U.S.C. 154(b) by 0 days.

(21) Appl. No.: 15/554,006

(22) PCT Filed: May 13, 2016

(86) PCT No.: PCT/KR2016/005129
§ 371 (c)(1),
(2) Date: Aug. 27, 2017

(87) PCT Pub. No.: WO2016/200067
PCT Pub. Date: Dec. 15, 2016

(65) Prior Publication Data
US 2018/0080827 A1    Mar. 22, 2018

(30) Foreign Application Priority Data
Jun. 7, 2015    (KR) ........................ 10-2015-0080260

(51) Int. Cl.
*G01J 3/28*    (2006.01)
*H04N 5/225*    (2006.01)
(Continued)

(52) U.S. Cl.
CPC ............ *G01J 3/2823* (2013.01); *G01J 3/0256* (2013.01); *G01J 3/10* (2013.01); *G01J 3/12* (2013.01);
(Continued)

(58) Field of Classification Search
CPC .......... G01J 3/2823; G01J 3/0256; G01J 3/10; G01J 3/12; H01L 31/147; H04N 5/2257; H04N 5/23232

See application file for complete search history.

(56) References Cited

U.S. PATENT DOCUMENTS 7,835,002 B2    11/2010    Muhammed
8,160,293 B1    4/2012    Fridrich
(Continued)

FOREIGN PATENT DOCUMENTS

KR    10-0848763 B1    7/2008
KR    10-0915204 B1    9/2009

OTHER PUBLICATIONS http://www.unispectral.com/how-it-works/ (technology described herein, viewed on Aug. 17, 2017).
(Continued)

*Primary Examiner* — Nelson D. Hernández Hernández (57) ABSTRACT

A hyperspectral camera apparatus is disclosed. The disclosed hyperspectral camera includes a plurality of semiconductor light sources to illuminate the subject with different wavelengths of light, an image sensor to acquire the image of the subject illuminated by the semiconductor light sources, and at least one optical filter provided in front of the image sensor to selectively transmit particular wavelengths of light onto the sensor.

17 Claims, 8 Drawing Sheets

(51) Int. Cl.
- *G01J 3/02* (2006.01)
- *G01J 3/10* (2006.01)
- *H04N 5/232* (2006.01)
- *G01J 3/12* (2006.01)
- *H01L 31/147* (2006.01)
- *H01L 31/028* (2006.01)
- *H01L 31/0296* (2006.01)
- *H01L 31/0304* (2006.01)
- *H01L 31/0312* (2006.01)
- *H01L 31/032* (2006.01)
- *H04N 5/268* (2006.01)

(52) U.S. Cl.
CPC .............. *G01J 3/28* (2013.01); *H01L 31/147* (2013.01); *H04N 5/2257* (2013.01); *H04N 5/23232* (2013.01); *G01J 2003/104* (2013.01); *G01J 2003/1213* (2013.01); *G01J 2003/2826* (2013.01); *H01L 31/028* (2013.01); *H01L 31/02966* (2013.01); *H01L 31/0304* (2013.01); *H01L 31/0312* (2013.01); *H01L 31/0324* (2013.01); *H01L 31/03046* (2013.01); *H04N 5/268* (2013.01)

(56) References Cited

U.S. PATENT DOCUMENTS

| | | | |
|---|---|---|---|
| 8,233,148 | B2 | 7/2012 | Bodkin |
| 8,913,241 | B2 | 12/2014 | Bhatia |
| 2014/0293091 | A1 | 10/2014 | Rhoads |
| 2015/0044098 | A1* | 2/2015 | Smart .................. A61B 5/0013 422/82.05 |
| 2015/0051498 | A1* | 2/2015 | Darty .................... A61B 5/447 600/477 |
| 2015/0124067 | A1 | 5/2015 | Bala |

OTHER PUBLICATIONS

A. Hegyi and J. Martini, "Hyperspectral imaging with a liquid crystal polarization interferometer," Optics Express, vol. 23, No. 22, 28742-28754 (2015).

Y. Garini, I. T. Young and G. McNamara, "Spectral Imaging: Principles and Applications", Cytometry Part A 69A:735-747 (2006).

Hui Huang, Li Liu and Michael O. Ngadi, "Recent Developments in Hyperspectral Imaging for Assessment of Food Quality and Safety", Sensors, 14, 7248-7276 (2014).

Andy Lambrechts, Pilar Gonzalez, Bert Geelen, Philippe Soussan, Klaas Tack and Murali Jayapala, "A CMOS-compatible, integrated approach to hyper- and multispectral imaging", Electron Devices Meeting (IEDM), 10.5.1-10.5.4 (2014).

* cited by examiner

Front Side

Rear Side

Figure 6

Front Side

Rear Side

Figure 7

Front Side                Rear Side (a)

PORTABLE HYPERSPECTRAL CAMERA APPARATUS HAVING SEMICONDUCTOR LIGHT EMITTING DEVICES

CROSS-REFERENCE TO RELATED APPLICATIONS

This application is a continuation of International Application No. PCT/KR2016/005129 filed May 13, 2016, which is a continuation of Korean Application No. 10-2015-0080260 filed Jun. 7, 2015.

BACKGROUND OF THE INVENTION

Unlike common digital color cameras, hyperspectral cameras have the unique capability to produce images containing chemical characteristics of the subject by adding spectroscopic capabilities into the camera. More specifically, hyperspectral cameras capture multiple images of the subject, where each image is created using a different narrow wavelength band of light. The light that forms the image is described by its spectral width (bandwidth), its wavelength range (spectral range), and the number of wavelength bands (band number). The multiple images, each created by a different wavelength band, are then combined to produce a 3-dimensional hypercube which is analyzed to identify the subject's characteristics. Detailed principles of hyperspectral cameras can be found for example in the reference "Y. Garini, I. T. Young and G. McNamara, "Spectral Imaging: Principles and Applications", Cytometry Part A 69A:735-747 (2006)", and hence will not be discussed here in detail. Furthermore, an example of its application in the food industry can be found in "Hui Huang, Li Liu and Michael O. Ngadi, "Recent Developments in Hyperspectral Imaging for Assessment of Food Quality and Safety", Sensors, 14, 7248-7276 (2014)".

The 3-dimensional hypercube can be acquired by spatial scanning, spectral (wavelength) scanning, or non-scanning snapshot method.

In the spatial scanning method, a 1-dimensional array sensor is used to create a 2-dimensional image by moving the sensor (i.e., the camera) or the subject using one particular wavelength band, and the process is continuously repeated using different wavelength bands. In the spectral (wavelength) scanning method, a 2-dimensional array sensor is used to acquire an image using one particular wavelength band, and the process is continuously repeated using different wavelength bands without the need to move the camera or the subject. In the non-scanning snapshot method, multiple images are acquired at one time to create a 3-dimensional hypercube, with each image formed by a different wavelength band.

For the spatial and spectral scanning methods, acquiring images using different wavelengths can be achieved by employing various spectral filters that allow transmission of specific wavelengths of light, or by employing tunable spectral filters that alter the wavelength of the transmitting light. Drawbacks to these methods involve the need for mechanical movement of components or the use of expensive tunable spectral filters. The image sensors used in the non-scanning snapshot method are able to capture images using different wavelengths by having each pixel subdivided into multiple subpixels, each of which is equipped with a different spectral filter than another. One major disadvantage of this method is that as the number of spectral bands desired increases, the image sensor size must also increase, leading to much higher cost. A detailed discussion of the image sensors used in hyperspectral cameras can be found for example in the reference [Andy Lambrechts, Pilar Gonzalez, Bert Geelen, Philippe Soussan, Klaas Tack and Murali Jayapala, "A CMOS-compatible, integrated approach to hyper- and multispectral imaging", Electron Devices Meeting (IEDM), 10.5.1-10.5.4 (2014)].

Light sources employed by typical hyperspectral cameras include sunlight when operated outdoors, and incandescent light bulbs, compact fluorescent lamps (CFL), or white light emitting diodes (LED) when operated indoors. Because the sunlight spans continuously from the ultraviolet (UV) to the far infrared (IR), it is possible to acquire images using a wide spectral range with sunlight as the light source. Incandescent light bulbs also emit a wide range of wavelengths (about 300 nm to 2000 nm) but due to its low energy efficiency they are not widely used anymore as indoor lighting. While compact fluorescent lamps and white light emitting diodes are widely used for their high visible spectral content, obtaining spectral images using these light sources becomes extremely difficult due to the lack of UV and IR contents.

BRIEF SUMMARY OF THE INVENTION

The present invention relates to hyperspectral camera apparatus, and more specifically relates to portable hyperspectral camera apparatus using a plurality of semiconductor light sources. Portable hyperspectral cameras can be used in a variety of useful applications such as identifying nutritional information and pesticide residue of fruits and vegetables, examining human skin conditions, checking for counterfeit currency, and inspecting the growth and health of plants.

DESCRIPTION OF THE KEY COMPONENTS REFERENCED IN THE FIGURES

10: Configuration of the hyperspectral camera in accordance with an embodiment of the present invention 20: Hyperspectral camera apparatus according to a specific embodiment of the present invention 30: Hyperspectral camera apparatus according to another embodiment of the present invention 40: Hyperspectral camera apparatus according to yet another embodiment of the present invention

| 110: Plurality of semiconductor light sources | 120: Image sensor |
| 130: Optical filter | 140: Optical lens |

DETAILED DESCRIPTION OF THE INVENTION

Prior Art

The present invention solves the prior art's shortcomings such as the need for exchange and mechanical movement of multiple spectral filters, expensive tunable spectral filters or image sensors having different wavelength filters at each pixel. Consequently, the present invention can be made into a portable, low cost hyperspectral camera. Furthermore, the present invention utilizes semiconductor light sources to enable capturing images using UV to IR spectral bands even under indoor conditions, where virtually no UV or IR light is present.

Technical Solution

The present invention comprises a hyperspectral camera equipped with semiconductor light sources for illuminating the subject with multiple wavelengths of light, an image sensor that acquires the image illuminated by the semiconductor light sources, and at least one optical filter placed in front of the image sensor to selectively restrict the light entering the image sensor.

A unique feature of the present invention is the use of plurality of semiconductor light sources that sequentially blink to illuminate the subject, effectively providing a wavelength scanning image capturing without the need for applying spectral filters in front of the image sensor.

Benefits of the Invention

The hyperspectral camera described in the present invention, by using a plurality of semiconductor light sources that provide a plurality of wavelengths, avoids the use of expensive tunable spectral filters, enabling the camera module to be made in a simple, inexpensive, and portable manner. In addition, because of the semiconductor light sources, high quality spectral images can be captured even under low indoor lighting conditions.

BEST MODES OF OPERATION OF THE INVENTION

Figure 1:
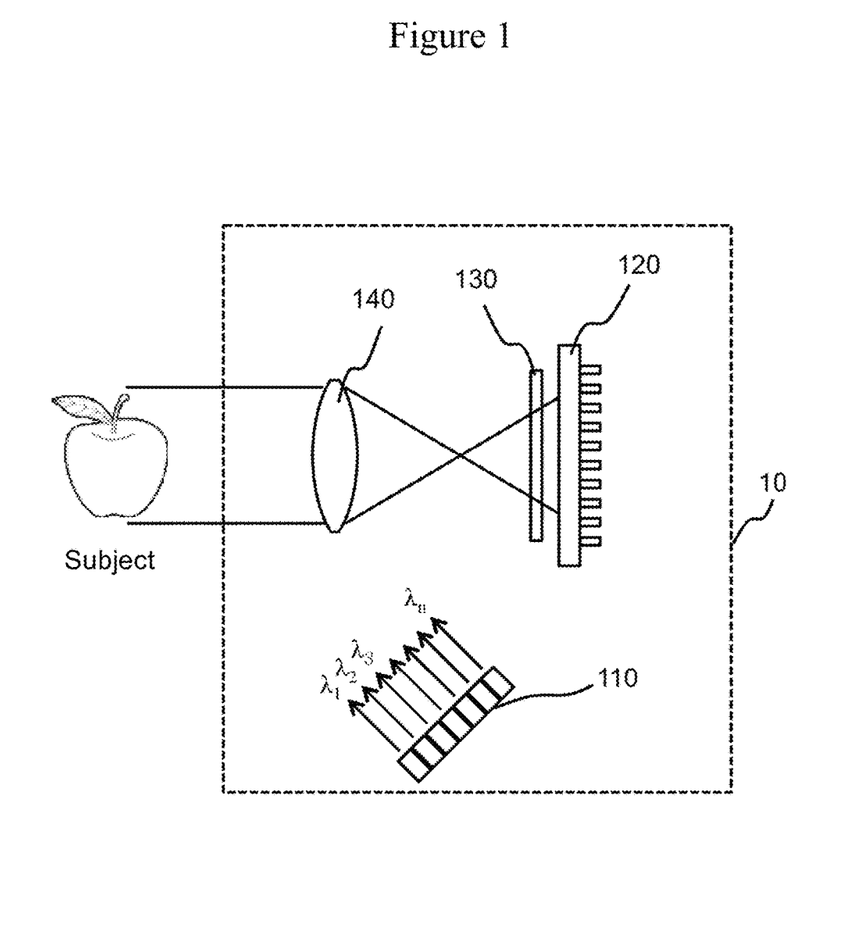
FIG. 1: Schematic configuration of the hyperspectral camera apparatus according to the present invention.

Referring to the accompanying figures, the detailed description of the configuration and the best modes of operation of the present invention will be presented below. In the figures, each component is indicated by a reference number, and in some cases the size of the elements in the drawings may be exaggerated for purpose of clarity and convenience. Referring to FIG. 1, an embodiment of the hyperspectral camera (10) described in the present invention includes a plurality of semiconductor light sources (110) that illuminate the subject with different spectral wavelengths, an image sensor (120) to acquire the image of the subject illuminated by the semiconductor light sources, one or more optical filters (130) provided in front of the image sensor (120) to selectively restrict certain wavelength range of the incident light, and an optical lens (140) provided in front of the image sensor (120) to collect the light onto the sensor.

The semiconductor light sources (110) are operated in a current injection mode, and can be either LEDs (Light Emitting Diodes) or LDs (Laser Diodes). The FWHM (Full Width Half Maximum) of the spectral distribution of semiconductor light sources (110) can vary widely from 0.1 nm to 100 nm, but preferably between few nm to tens of nm. The desired spectral FWHM can be obtained for example, by using an RC (Resonant Cavity) LED. Depending on the application, the wavelength of the semiconductor light source can be selected between 200 nm and 3000 nm. More specifically, for wavelengths in the 200~600 nm range GaN based materials (InGaAlN, AlGaN, InGaN, etc.) may be used, for 600~1200 nm range GaAs based materials (InGaAlP, InGaP, InGaAs, InGaAsP, etc.) may be used, and for wavelengths greater than 1200 nm, InP based materials (InGaAsP, InGaAs, InGaAlAs, etc.) may be used.

Figure 2:
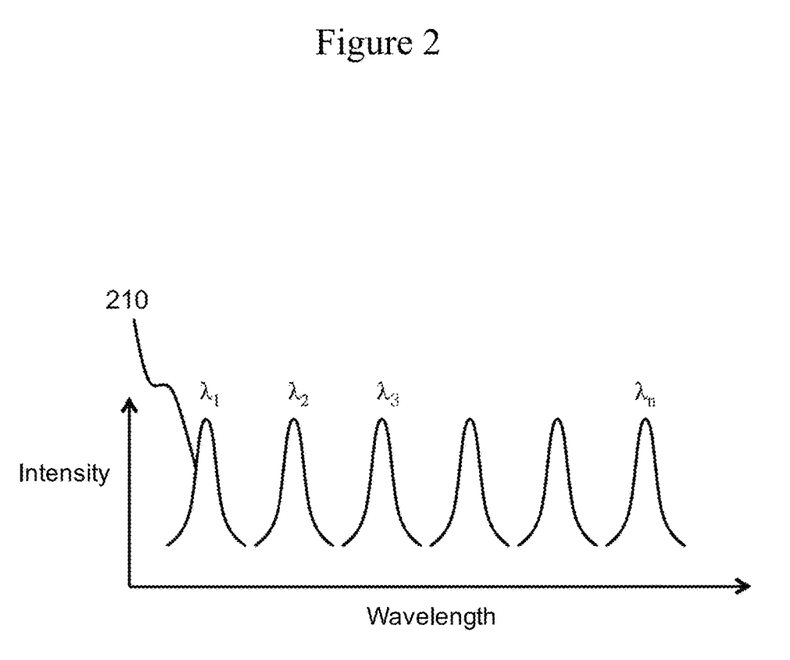
FIG. 2: Schematic representation of the spectral shape output from the semiconductor light sources according to the present invention.

Referring to FIG. 2, the invention comprises at least two semiconductor light sources (110) in which the spectral output from the light sources as schematically displayed in (210) can be completely separated or partially overlapping. The spectrum from each of the semiconductor light source is equivalent to the spectrum of the light that arrives at the image sensor after passing through a spectral filter, as in prior art hyperspectral cameras, and the number of semiconductor light sources is equivalent to the number of bands (band number). With increasing number of semiconductor light sources within a given spectral range, the accuracy of the hyperspectral camera is improved. In accordance with an embodiment of the invention, the semiconductor light sources (110) may be a tunable wavelength device that can change the emission wavelength.

The hyperspectral camera (10) as shown in FIG. 1 includes an image sensor (120). The image sensor (120) may be a CCD (Charge Coupled Device), a CIS (CMOS Image Sensor), or a Photodiode Array, and the light absorbing material of the image sensor may be made from a Group IV semiconductor system such as Si, SiGe, and Ge, from Group III-V semiconductor system such as GaAs, InAs, InGaAs, GaSb, InSb, and InGaSb, from a Group II-VI semiconductor system such as HgCdTe, or from a Group IV-VI semiconductor system such as PbS.

Figure 3:
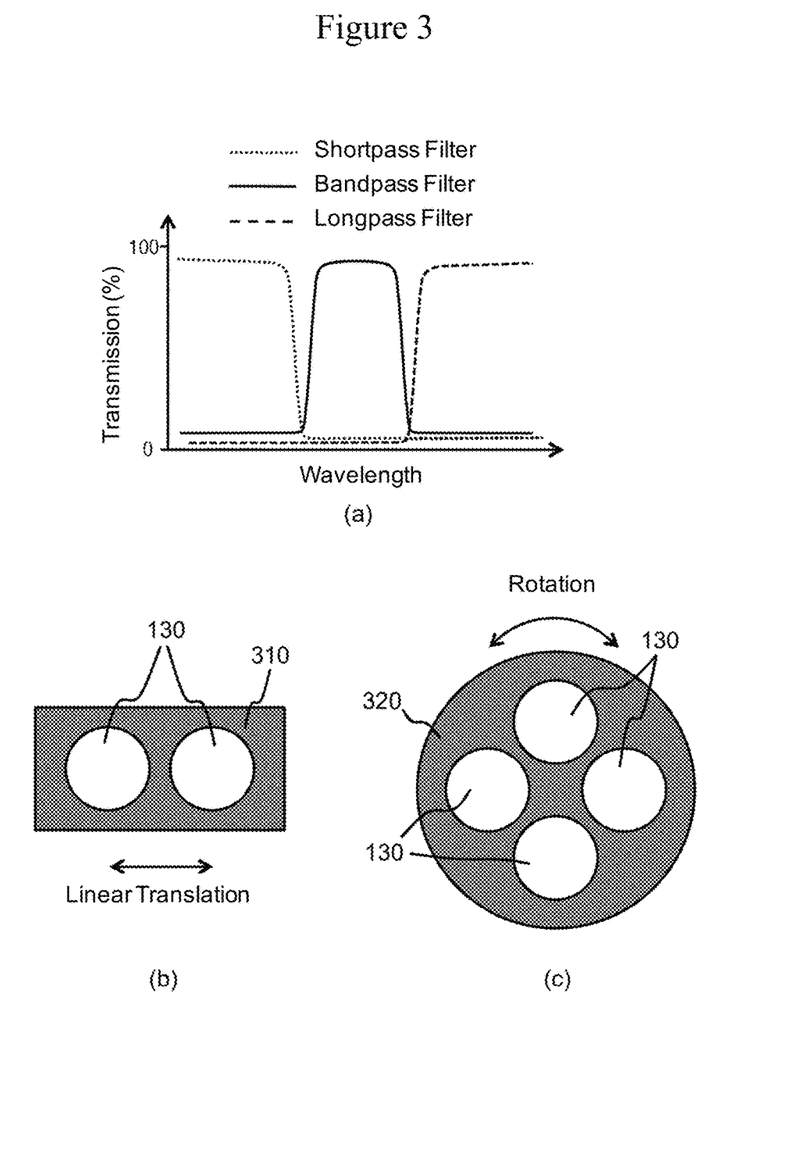
FIG. 3a: Schematic optical transmission spectra of a Shortpass Filter, Bandpass Filter, and Longpass Filter according to the present invention.
FIG. 3b: Schematic illustration showing the method of using two optical filters according to the present invention.
FIG. 3c: Schematic illustration showing the method of using at least three optical filters according to the present invention.

The hyperspectral camera (10) as shown in FIG. 1 includes at least one optical filter (130). The optical filter (130) may be one or more of the following filter types: a longpass filter that transmits only light longer than a certain wavelength, a shortpass filter that transmits only light shorter than a certain wavelength, and a bandpass filter that transmits only light within a certain range of wavelengths. The transmission spectra of these optical filters are schematically shown in FIG. 3a. The optical filter (130) may be constructed from dielectric films with alternating refractive indices, or from organic or inorganic material that can selectively absorb or transmit certain wavelengths, or may be a Fabry Perot filter. The optical filter (130) as shown in FIG. 1 is located between the optical lens (140) and the image sensor (120), but its location is not limited to this as long as it is positioned in front of the image sensor (120) along the optical path. The optical filters described in the present invention are different from the spectral filters used in prior art in that the spectral transmittance widths of the optical filters are wider than the combined spectral widths of at least two semiconductor light sources, while the spectral transmittance widths of the spectral filters correspond to individual spectral width (bandwidth) of the light that makes the spectral image.

The optical filter assembly can be composed of two or more optical filters (130). FIG. 3b depicts a case in which two different optical filters (130) are assembled in a holder (310) that reciprocates in a straight line, allowing the use of either filter based on the need. For example, both longpass filter and shortpass filter can be alternately used, or two different longpass filters can be alternately used. There is no practical limit to the number of different combinations of the optical filters that can be employed. In another case as shown in FIG. 3c, three or more optical filters (130) may be assembled in a rotating holder (320) to allow access to different optical filters.

The hyperspectral camera (10) shown in FIG. 1 may be equipped with an optical lens (140). The optical lens (140) may be a single lens or multiple set of lenses that functions to collect the incoming light and deliver it onto the image sensor. The optical lens (140) may be made of optically transparent glass, plastic, or other similar materials. The optical lens (140) may be coated on one side with dielectric films of alternating refractive indices, thereby combining the function of the optical filter (130) with the optical lens (140).

The operating principle of the present invention will now be briefly described with reference to FIG. 1. First, a reference image of the subject is taken with the semiconductor light sources (110) turned off. Next, images are obtained using each of the wavelengths associated with the semiconductor light sources, as they are sequentially flashed. For example, the first image is obtained using only the wavelength of the first semiconductor light source while all others are turned off, then the second image is obtained using only the wavelength of the second semiconductor light source while all others are turned off, and so on. The image sensor (120) used in the present invention does not require spectral filters in front of the pixels. Therefore, because the ambient light contributes to the signal when an image is obtained with a semiconductor light source, the reference image obtained with all the semiconductor light sources turned off needs to be subtracted in order to create a high quality image using only the specific wavelengths emitted from the semiconductor light source. By using this method, hypercubes can be obtained with ordinary image sensors which do not employ tunable spectral filters.

One potential problem with this approach is the low signal to noise ratio that can result when the ambient light intensity is strong relative to that of the semiconductor light source. This problem is solved in the present invention by using appropriate optical filters. In other words, when creating a spectral image in the ultraviolet region, a 400 nm shortpass filter for example, can block most of the typical indoor ambient light of wavelengths longer than 400 nm. Conversely, when creating a spectral image in the infrared region, a 750 nm or 800 nm longpass filter for example, can be used to block most of the typical indoor ambient light of wavelengths shorter than 750 nm or 800 nm, thereby increasing the signal to noise ratio. When creating a spectral image in the visible region, a bandpass filter can be used to transmit only a specific region of the visible region, thereby increasing the signal to noise ratio.

Figure 4:
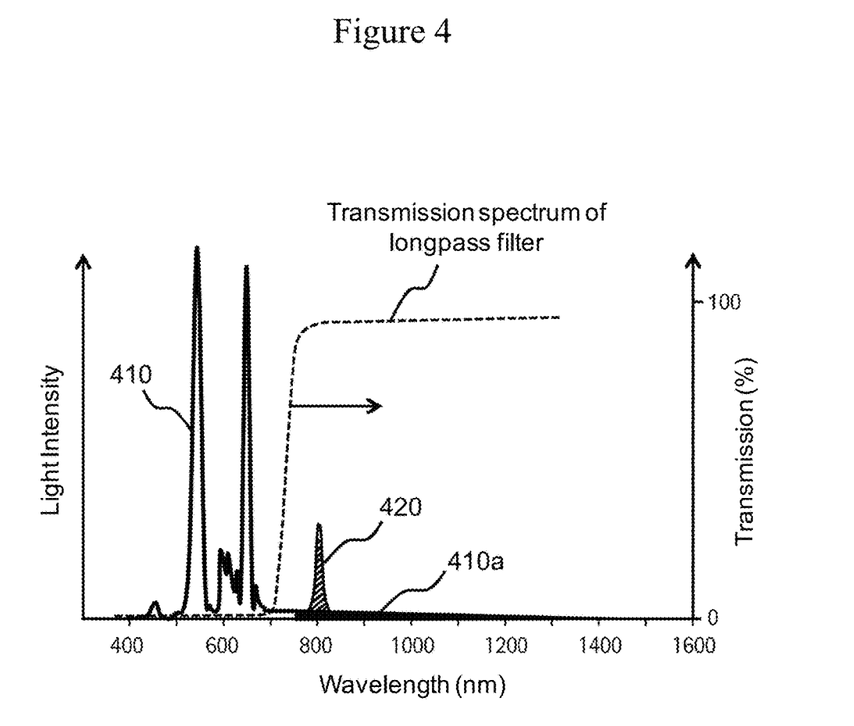
FIG. 4: Schematic illustration of a typical indoor fluorescent spectrum highlighting the principle of obtaining a spectral image using infrared wavelengths.

FIG. 4, which shows a typical indoor fluorescent spectrum, will be used to present an example of acquiring an infrared spectral image, and thereby aid in understanding the concept. By using for example a 750 nm longpass filter, wavelengths shorter than 750 nm are blocked and only the low intensity light in the region indicated (410a) from the fluorescent spectrum (410) shown in FIG. 4 is allowed to be absorbed by the image sensor. Consequently, the reference image taken with the semiconductor light sources turned off will be comprised only of the light as indicated as region (410a) of FIG. 4. Under this condition, if a semiconductor light source of wavelength 800 nm is used to generate an image, both the semiconductor light source (420) and the background light (410a) are absorbed by the image sensor. To obtain the final image made up of only the semiconductor light source (420), the reference image created using signal (410a) is simply subtracted from the acquisition image.

MODES OF OPERATION OF THE INVENTION

Hereafter, the embodiments of the present invention are presented in detail with reference to FIGS. 5-8.

Figure 5:
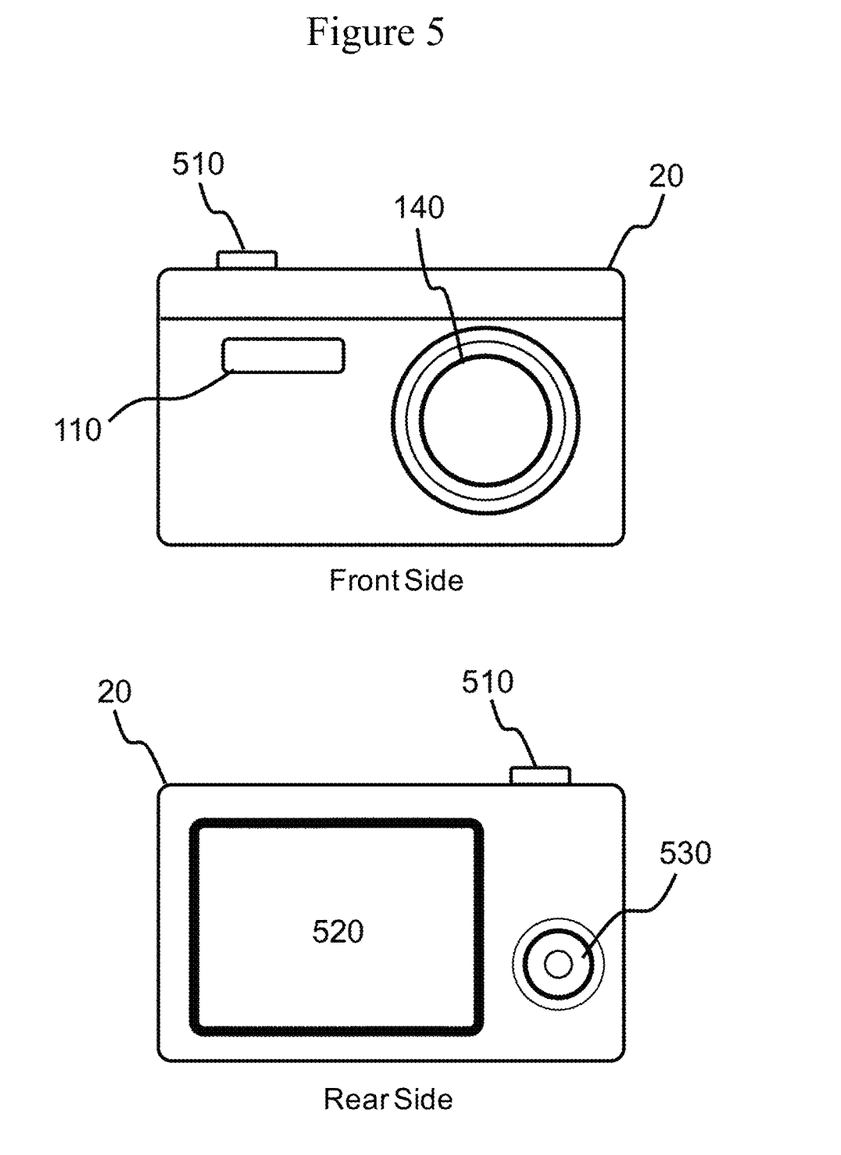
FIG. 5: Illustration of the hyperspectral camera apparatus according to the first embodiment of the present invention.

The present invention as shown in FIG. 5 can be configured as an independent device to operate as a hyperspectral camera (20). The front side of the hyperspectral camera (20) may be provided with an optical lens (140) and although not indicated in FIG. 5, an optical filter (130) and an image sensor (120) may be configured behind the optical lens (140). The optical filter (130) may be configured as a single unit as well as multiple units. The optical filter may be applied on the optical lens (140). The front side of the independent hyperspectral camera (20) may be equipped with a plurality of semiconductor light sources (110). There is no restriction on the particular location of the semiconductor light sources (110). The upper part of the independent hyperspectral camera (20) may have a shutter button (510) while the rear side may contain a display (520) and an operation button (530) such that the subject can be viewed during and after acquiring the image. In addition, this embodiment may include a memory device to store the acquired images and the hypercubes formed by the nested images as well as a reference data library containing chemical signatures of various subject materials, a semiconductor processor to control the camera operation and image processing, and a software program to control all of these elements.

Figure 6:
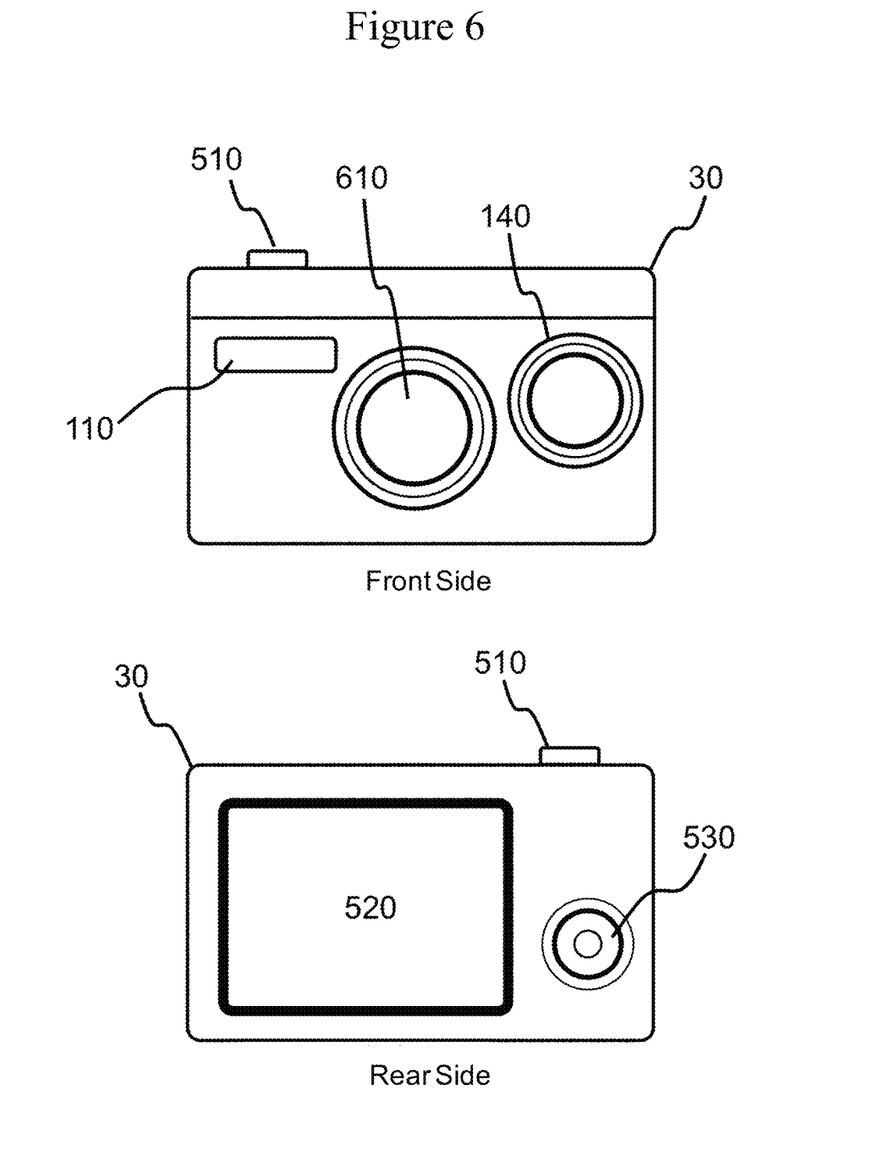
FIG. 6: Illustration of the hyperspectral camera apparatus according to the second embodiment of the present invention.

In another embodiment of the present invention, FIG. 6 illustrates the invention in a form (30) as integrated into a standard digital camera. In this embodiment standard digital camera may be provided with an optical lens (610) and although not indicated in FIG. 6, an image sensor inside the camera to capture standard images. On the same side, the optical lens (140) for the hyperspectral camera may be provided, and although not indicated in FIG. 6, an optical filter (130) as well as an image sensor (120) may be included inside the unit. Furthermore plurality of semiconductor light sources (110) may be configured on the same side of the camera. This embodiment of the invention (30) may have a shutter button (510) while the rear side may contain a display (520) and an operation button (530) such that the subject can be viewed during and after acquiring the image.

Yet in another embodiment of the present invention as illustrated in FIG. 7a, the present invention may be coupled to a portable electronic device such as a smartphone (710) such that the hyperspectral camera unit (40) is detachable from the main device. In this embodiment one side of the hyperspectral camera (40) may contain an optical lens (140) and although not indicated in FIG. 7a, an optical filter (130) and an image sensor (120) may also be included inside the unit. In addition, plurality of semiconductor light sources (110) may be configured on the same side as the optical lens (140) of the hyperspectral camera (40). Although not shown in FIG. 7a, the hyperspectral camera (40) and the smartphone (710) may be connected to each other by a mechanically detachable connector to allow data transfer. As shown in FIG. 7a, the smartphone (710) and the hyperspectral camera (40) may be combined to face in opposite directions to allow real time viewing on the display (720) of the smartphone (710) for convenient image capturing. In the embodiment of FIG. 7a, the hyperspectral camera (40) is coupled to the bottom of the smartphone (710), but it may also be coupled to the upper or rear sides of the smartphone. Also shown in FIG. 7a for reference are an optical lens (730) and a flash (740) for use in standard image capturing.

In yet another embodiment as shown in FIG. 7b, the smartphone (710) and the hyperspectral camera (40) are not rigidly connected to each other but may be operated by connecting the two components by a cable (750).

Figure 8:
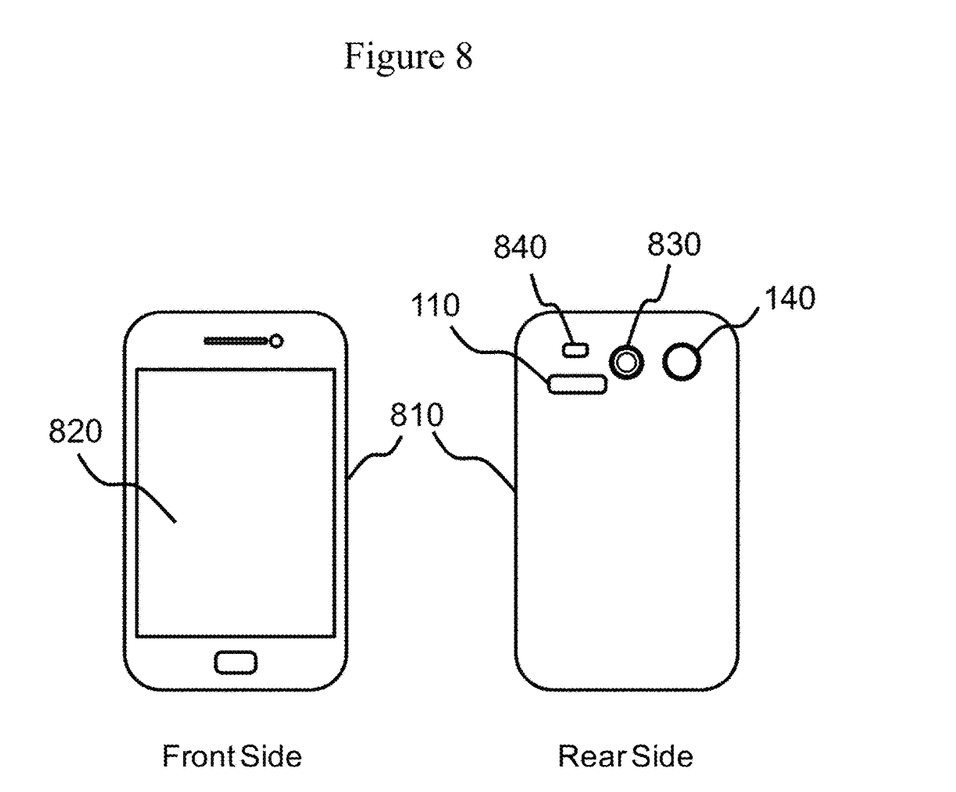
FIG. 8: Illustration of the hyperspectral camera apparatus according to the fifth embodiment of the present invention.

In another embodiment as shown in FIG. 8, the present invention may be packaged into a portable electronic device similar to a smartphone (810) and operated in this manner. In this embodiment, the smartphone (810) may be provided on one side with an optical lens (830) for the standard camera as well as an optical lens (140) for the hyperspectral camera, and although not indicated in FIG. 8, an optical filter (130) and an image sensor (120) may be included inside the unit. Furthermore on the same side, a plurality of semiconductor light sources (110) may be provided. Also shown in FIG. 8 for reference are a smartphone display (820) and a flash (840).

Figure 7:
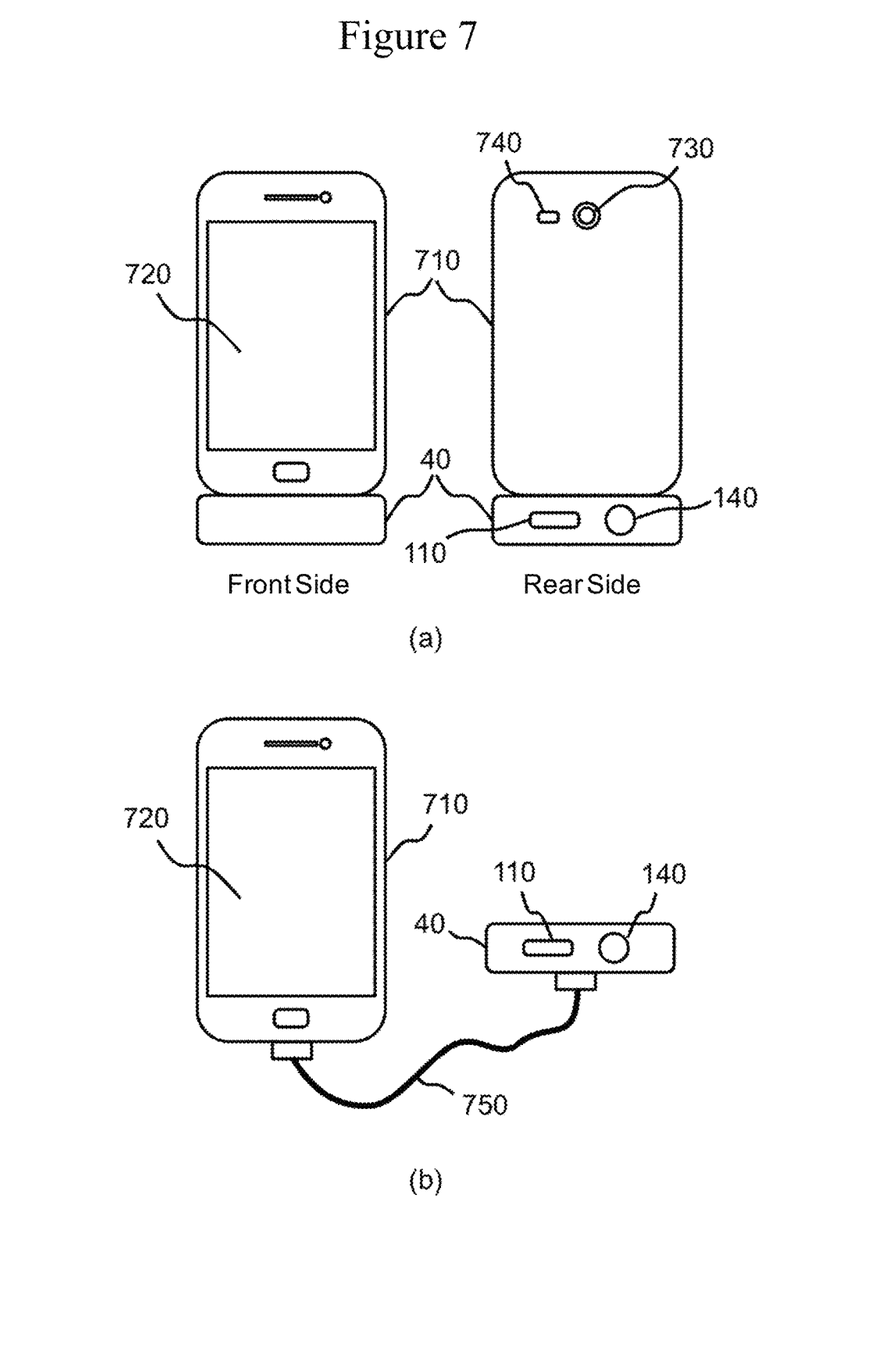
FIG. 7a: Illustration of the hyperspectral camera apparatus according to the third embodiment of the present invention.
FIG. 7b: Illustration of the hyperspectral camera apparatus according to the fourth embodiment of the present invention.

In the embodiments of FIGS. 7 and 8, although a smartphone is used to describe the invention for convenience, it is noted that other electronic devices such as a notebook computer and a tablet PC (personal computer) may also be used.

The hyperspectral camera as detailed in the embodiments of the present invention has been described with reference to the figures in order to aid in understanding the invention. However, an ordinary person skilled in the art should recognize that various modifications and other similar embodiments are possible. Therefore the true technical scope of the invention should be defined by the appended claims.

INDUSTRIAL APPLICABILITY

One of the important features of the present invention is that unlike prior art, the present invention allows one to configure the apparatus using mostly off-the-shelf or already commercialized components. For example, image sensors used in ordinary digital cameras can be used, as well as conventional optical filters for selectively limiting the wavelength of the light incident on the image sensor. Another important feature of the present invention is the use of off-the-shelf semiconductor light emitting devices including compound semiconductor light emitting diodes as the critical component providing a variety of incident light from ultraviolet to infrared wavelengths. Furthermore if wavelengths of light other than those provided by off the-shelf semiconductor light emitting devices are needed, they can be easily provided by changing the composition of the compound semiconductor materials used to fabricate the semiconductor light emitting devices.

The present invention has significant industrial applicability by providing a portable hyperspectral camera with high performance at an affordable price that enables consumers to utilize the apparatus in their daily lives. For example, any person carrying the portable camera of the present invention can use it for many useful applications such as identifying counterfeit currency and product labels, obtaining nutritional information of food, measuring human skin condition, and identifying the development state of plants, all of which contribute to improving the quality of life. The assortment of applications will continue to expand as the volume of user data increases.

The invention claimed is:

1. A spectral imaging apparatus comprising:
   a plurality of semiconductor light sources, wherein every one of the plurality of semiconductor light sources emits a different illumination wavelength than the others, and sequentially illuminates a subject one at a time by momentarily turning on while all others are off, thereby generating a set of images in which one image is formed by each of the illumination wavelengths;
   an image sensor that is time synchronized with the plurality of semiconductor light sources for acquiring images of the subject sequentially illuminated by the plurality of semiconductor light sources, wherein the characteristic wavelength used to generate each image is determined uniquely by the characteristic illumination wavelength emitted by the semiconductor light source; and
   one or more optical filters disposed on the image sensor, wherein the one or more optical filters allows the light emitted by the semiconductor light sources to pass while blocking other wavelengths present in ambient light, and is of the type:
   (i) a longpass filter whose optical transmittance is designed to pass all of the wavelengths emitted by the semiconductor light sources while blocking all of the wavelengths shorter than the shortest wavelength emitted by the semiconductor light sources,
   (ii) a shortpass filter whose optical transmittance is designed to pass all of the wavelengths emitted by the semiconductor light sources while blocking all of the wavelengths longer than the longest wavelength emitted by the semiconductor light sources, or
   (iii) a bandpass filter whose optical transmittance is designed to pass all of the wavelengths emitted by the semiconductor light sources while blocking all of the wavelengths shorter than the shortest wavelength emitted by the semiconductor light sources and longer than the longest wavelength emitted by the semiconductor light sources.

2. The apparatus of claim 1, wherein the plurality of semiconductor light sources are selected from one or more of the following semiconductor devices including Light Emitting Diode, Resonant Cavity-Light Emitting Diode, and Laser Diode.

3. The apparatus of claim 2, wherein the plurality of semiconductor light sources provide fixed or variable wavelength light that ranges from minimum 200 nm to maximum 3000 nm, and which are fabricated from one or more of the following semiconductor materials including GaN based (InGaAlN, AlGaN, InGaN), those generally compatible with a GaAs substrate (InGaAlP, InGaP, InGaAs, InGaAsP), and those generally compatible with an InP substrate (InGaAsP, InGaAs, InGaAlAs) depending on the desired wavelength.

4. The apparatus of claim 1, wherein the image sensor is a Charge Coupled Device, a CIS (CMOS Image Sensor), or a Photodiode array.

5. The apparatus of claim 4, wherein the image sensor includes light sensing material constructed from a Group IV semiconductor system including Si, SiGe, and Ge, a Group III-V semiconductor system including GaAs, InAs, InGaAs, GaSb, InSb, and InGaSb, a Group II-VI semiconductor system including HgCdTe, or a Group IV-VI semiconductor system including PbS.

6. A spectral imaging apparatus comprising:
a plurality of semiconductor light sources, wherein every one of the plurality of semiconductor light sources emits a different illumination wavelength than the others, and sequentially illuminates a subject one at a time by momentarily turning on while all others are off, thereby generating a set of images in which one image is formed by each of the illumination wavelengths;
an image sensor that is time synchronized with the plurality of semiconductor light sources for acquiring images of the subject sequentially illuminated by the plurality of semiconductor light sources, wherein the characteristic wavelength used to generate each image is determined uniquely by the characteristic illumination wavelength emitted by the semiconductor light source; and
one or more optical filters disposed on the image sensor, wherein the one or more optical filters allows the light emitted by the semiconductor light sources to pass while blocking other wavelengths present in ambient light, and is of the type:
(i) a longpass filter whose optical transmittance is designed to pass all of the wavelengths emitted by the semiconductor light sources while blocking all of the wavelengths shorter than the shortest wavelength emitted by the semiconductor light sources,
(ii) a shortpass filter whose optical transmittance is designed to pass all of the wavelengths emitted by the semiconductor light sources while blocking all of the wavelengths longer than the longest wavelength emitted by the semiconductor light sources, or
(iii) a bandpass filter whose optical transmittance is designed to pass all of the wavelengths emitted by the semiconductor light sources while blocking all of the wavelengths shorter than the shortest wavelength emitted by the semiconductor light sources and longer than the longest wavelength emitted by the semiconductor light sources; and
an Input/Output (I/O) interface that transmits subject image data acquired by the image sensor to an external portable electronic device.

7. The apparatus of claim 6, wherein the plurality of semiconductor light sources are selected from one or more of the following semiconductor devices including Light Emitting Diode, Resonant Cavity-Light Emitting Diode, and Laser Diode.

8. The apparatus of claim 7, wherein the plurality of semiconductor light sources provide fixed or variable wavelength light that ranges from minimum 200 nm to maximum 3000 nm, and which are fabricated from one or more of the following semiconductor materials including GaN based (InGaAlN, AlGaN, InGaN), those generally compatible with a GaAs substrate (InGaAlP, InGaP, InGaAs, InGaAsP), and those generally compatible with an InP substrate (InGaAsP, InGaAs, InGaAlAs) depending on the desired wavelength.

9. The apparatus of claim 6, wherein the image sensor is a Charge Coupled Device, a CIS (CMOS Image Sensor), or a Photodiode array.

10. The apparatus of claim 9, wherein the image sensor includes light sensing material constructed from a Group IV semiconductor system including Si, SiGe, and Ge, a Group III-V semiconductor system including GaAs, InAs, InGaAs, GaSb, InSb, and InGaSb, a Group II-VI semiconductor system including HgCdTe, or a Group IV-VI semiconductor system including PbS.

11. The apparatus of claim 6, wherein the external portable electronic device is a digital camera, a smartphone, a notebook computer, or a tablet computer.

12. An integrated spectral imaging apparatus comprising:
a portable electronic device;
a plurality of semiconductor light sources, wherein every one of the plurality of semiconductor light sources emits a different illumination wavelength than the others, and sequentially illuminates a subject one at a time by momentarily turning on while all others are off, thereby generating a set of images in which one image is formed by each of the illumination wavelengths;
an image sensor that is time synchronized with the plurality of semiconductor light sources for acquiring images of the subject sequentially illuminated by the plurality of semiconductor light sources, wherein the characteristic wavelength used to generate each image is determined uniquely by the characteristic illumination wavelength emitted by the semiconductor light source; and
one or more optical filters disposed on the image sensor, wherein the one or more optical filters allows the light emitted by the semiconductor light sources to pass while blocking other wavelengths present in ambient light, and is of the type:
(i) a longpass filter whose optical transmittance is designed to pass all of the wavelengths emitted by the semiconductor light sources while blocking all of the wavelengths shorter than the shortest wavelength emitted by the semiconductor light sources,
(ii) a shortpass filter whose optical transmittance is designed to pass all of the wavelengths emitted by the semiconductor light sources while blocking all of the wavelengths longer than the longest wavelength emitted by the semiconductor light sources, or
(iii) a bandpass filter whose optical transmittance is designed to pass all of the wavelengths emitted by the semiconductor light sources while blocking all of the wavelengths shorter than the shortest wavelength emitted by the semiconductor light sources and longer than the longest wavelength emitted by the semiconductor light sources.

13. The apparatus of claim 12, wherein the plurality of semiconductor light sources are selected from one or more of the following semiconductor devices including Light Emitting Diode, Resonant Cavity-Light Emitting Diode, and Laser Diode.

14. The apparatus of claim 13, wherein the plurality of semiconductor light sources provide fixed or variable wavelength light that ranges from minimum 200 nm to maximum 3000 nm, and which are fabricated from one or more of the following semiconductor materials including GaN based (InGaAlN, AlGaN, InGaN), those generally compatible with a GaAs substrate (InGaAlP, InGaP, InGaAs, InGaAsP), and those generally compatible with an InP substrate (InGaAsP, InGaAs, InGaAlAs) depending on the desired wavelength.

15. The apparatus of claim 12, wherein the image sensor is a Charge Coupled Device, a CIS (CMOS Image Sensor), or a Photodiode array.

16. The apparatus of claim 15, wherein the image sensor includes light sensing material constructed from a Group IV semiconductor system including Si, SiGe, and Ge, a Group III-V semiconductor system including GaAs, InAs, InGaAs, GaSb, InSb, and InGaSb, a Group II-VI semiconductor system including HgCdTe, or a Group IV-VI semiconductor system including PbS.

17. The apparatus of claim 12, wherein the portable electronic device is a digital camera, a smartphone, a notebook computer, or a tablet computer.

* * * * *